United States Patent
Atanackovic

(10) Patent No.: US 6,426,514 B1
(45) Date of Patent: Jul. 30, 2002

(54) DUAL NON-PARALLEL ELECTRONIC FIELD ELECTRO-OPTIC EFFECT DEVICE

(75) Inventor: Peter Branko Atanackovic, Astor Park (AU)

(73) Assignee: Defence Science and Technology Organisation (AU)

( * ) Notice: Subject to any disclaimer, the term of this patent is extended or adjusted under 35 U.S.C. 154(b) by 0 days.

(21) Appl. No.: 09/612,393

(22) Filed: Jun. 29, 2000

Related U.S. Application Data

(63) Continuation of application No. 09/236,261, filed on Jan. 22, 1999, now abandoned.

(51) Int. Cl.$^7$ .............................................. H01L 29/06
(52) U.S. Cl. ........................... 257/14; 257/12; 257/13; 257/14; 257/17; 257/20; 257/21; 257/35; 257/432
(58) Field of Search ............................ 257/12, 13, 14, 257/17, 20, 21, 35, 432

(56) References Cited

U.S. PATENT DOCUMENTS

| | | | | |
|---|---|---|---|---|
| 5,367,177 A | * | 11/1994 | Taylor et al. | 257/20 |
| 5,412,224 A | * | 5/1995 | Goronkin et al. | 257/15 |
| 5,825,049 A | * | 10/1998 | Simmons et al. | 257/25 |
| 5,959,317 A | * | 9/1999 | Niwa | 257/194 |

OTHER PUBLICATIONS

Goosen et al, "Single–Layer Structure Supporting Both Heterojunction Bipolar Transistor and Surface–Normal Modulator", IEEE Photonics Technology Letters, vol. 4, No. 4, Apr. 1992, pp. 393–395.

Chemla et al, "Modulation of Absorption in Field–Effect Quantum Well Structures", IEEE Journal of Quantum Electronics, vol. 24, No. 8, Aug. 1988, pp. 1664–1675.

Sargood et al, "A Quantum–Well Inversion Channel Heterostructure as a Multifunctional Component for Optoelectronic Integrated Circuits", IEEE Journal of Quantum Electronics, vol. 29, No. 1, Jan. 1993, pp. 136–149.

Miller, David A.B., "Novel Analog Self–Electrooptic–Effect Devices", IEEE Journal of Quantum Electronics, vol. 29, No. 2, Feb., 1993, pp. 678–698.

Wegener et al, "Electroabsorption and refraction by electron transfer in asymmetric modulation–doped multiple quantum well structures", Applied Physics, Lett. 55 (6), Aug. 7, 1989, pp. 583–585.

Chemla et al, "Nonlinear Optical Properties of Multiple Quantum Well Structures for Optical Signal Processing", Semiconductors and Semi Metals, vol. 24, 1987, pp. 279–318.

* cited by examiner

*Primary Examiner*—Jerome Jackson, Jr.
*Assistant Examiner*—Edgardo Ortiz
(74) *Attorney, Agent, or Firm*—Sand & Sebolt

(57) ABSTRACT

The present invention is for an improved modulator and detection device that use reversed biased diodes containing not intentionally doped (NID) optically active regions sandwiched between conductive layers of p-doped and n-doped semiconductor layers. A photo-current is generated using the optical non-linearity of multiple quantum structures inside the active region and that can be used in an external circuit to provide feedback to the device itself. This is commonly referred to as the self electro-optic effect device (SEED) where the applied electric field modulates the absorption (excitonic in nature due to the reduced dimensionality of the quantum well) of the active layer by the use of the quantum confined Stark effect. The present invention seeks to improve on known devices by separating the photo-current from the perpendicular biased electric field so as to produce a four electrical port device, by simultaneously applying non-parallel fields. In an optimum configuration one applies both perpendicular and parallel electric fields (that may be intrinsically or externally applied) to a material containing two-dimensional quantum wells (or superlattice) one dimensional quantum wires or zero dimensional quantum dots (comprising the active regions).

6 Claims, 12 Drawing Sheets

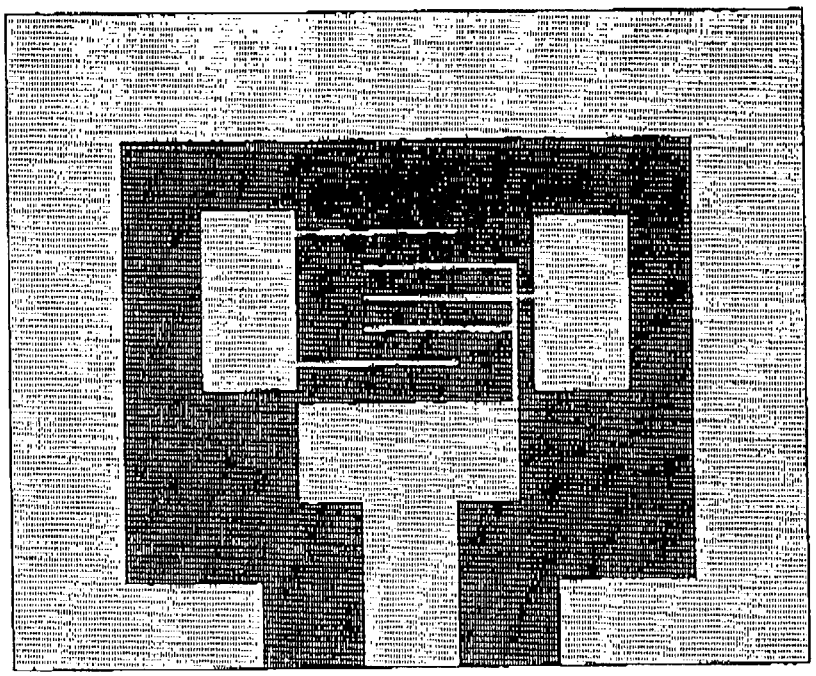
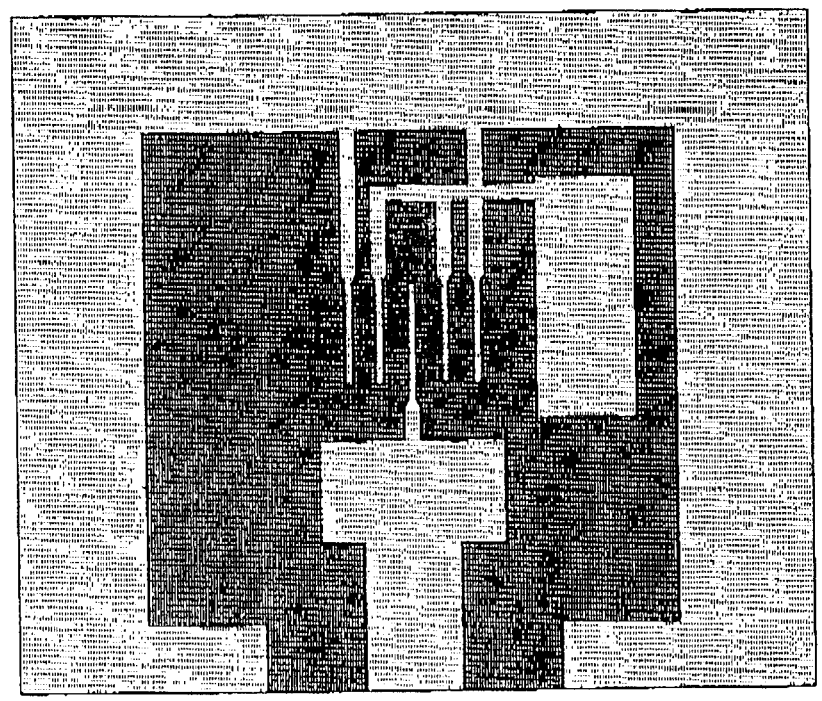
FIG 7

DUAL NON-PARALLEL ELECTRONIC FIELD ELECTRO-OPTIC EFFECT DEVICE

This application is a continuation of Ser. No. 09/236,261 filed Jan. 22, 1999, now abandoned.

The present invention relates to an electro-optical or single carrier electronic device that utilises the simultaneous application of two non-parallel electric fields.

BACKGROUND OF THE INVENTION

Opto-electronic devices are well known. They use a means responsive to light to generate a photo-current, a structure that has a semiconductor quantum well region, and a means that responds to the photo-current so as to electrically control an optical absorption of the semiconductor quantum well region. The optical absorption of the semiconductor quantum well region can vary in response to the variations in photo-current.

Conventional modulator and detection devices employ schemes that use reversed biased diodes containing not intentionally doped (NID) optically active regions sandwiched between conductive layers of p-doped and n-doped semiconductor layers. A photo-current generated will be superimposed upon the dark current of the reversed biased diode. Non-linear electro-optic effect and bistable devices are therefore essentially a two electrical port and two optical port (input and output) device. The photo-current that is generated using the optical non-linearity of multiple quantum structures inside the active region can be used in an external circuit to provide feedback to the device itself. This is commonly referred to as the self electro-optic effect device (SEED). The applied electric field modulates the absorption (excitonic in nature due to the reduced dimensionality of the quantum well) of the active layer by the use of the quantum confined Stark effect. The present invention seeks to improve on known devices by separating the photo-current from the perpendicular biased electric field so as to produce a four electrical port device, by simultaneously applying non-parallel fields. In an optimum configuration one applies both perpendicular and parallel electric fields (that may be intrinsically or externally applied) to a material containing two-dimensional quantum wells (or superlattice) one dimensional quantum wires or zero dimensional quantum dots (comprising the active regions).

The device predominantly consists of layered dissimilar semiconductor materials that comprise of combinations of bulk material and ultrathin layers utilising the quantum size effect. The device is structured so as to contain an optically active region such that the optical and/or electrical response can be altered by the application of externally applied electric fields. Depending up the type of active region, there exists spatial directions mostly perpendicular and parallel which can be used to either extract or inject current carriers (intrinsic to or photogenerated within the material) or modify built in electric potentials within the said active region.

SUMMARY OF THE INVENTION

The present invention is for devices that can have wave guide and grating implementations for coupling the input optical signal into the active region and coupling of the processed optical output from the device.

Using quantum well material, the modulation is accomplished by an electric field parallel to the growth direction (perpendicular to the plane of the semiconductor layers). The electric field is generated by two n-doped layers sandwiching the active regions. Electrical contacts are via OHMIC metallisation to the n-doped layer. Vertical transport (perpendicular to the plane of the layers) is inhibited through the active region by specially designed blocking layers for electrons and/or holes. These blocking layers are used to control the dark current of the device. A photo-current generated in the active region is therefore also inhibited from reaching these contacts. A simultaneously parallel applied electric field, which can be used to extract/inject current carriers is realised by electrically contacting the layers in a spatial direction parallel to plane of the quantum wells.

The single dopant species is especially useful for integration with high electron mobility transistors so as to be compatible with monolithic microwave integrated circuits processing. The device described may also manifest as an optical active region comprising of a single or multiple two-dimensional electron gas modulation doped hereto structure. The control of electron (or hole for the case of two-dimensional hole gas) concentration in the active region can also be used for modulation of both the optical and electrical properties.

The use of strain layer material comprising the quantum well region can be used to deform the in-plane energy dispersion (hole energy versus in-plane wave vector relationship) of the valence band so as to dramatically reduce the in-plane effective mass of the quantised hole subbands. This allows the device to be optimised for high speed applications requiring the fast extraction of holes from the active region. This concept is intrinsic to development of the dual field device described herein.

The invention can therefore be used as an electro-optic device suitable for the modulation of an optical signal (modulator) or detection of an optical signal (receiver). The unique feature is the separation of the photo-current generated within the optically receptive region of the device and the modulating field necessary for altering the absorption profile of the active region. Devices using a single carrier species (such as electrons or holes only, employ the same mechanism.

Optical radiation that is incident upon the device is coupled into the active region using two different configurations. Firstly, one can use a wave guide type geometry that is an optically guided wave mode mostly in the plane of the quantum well layers. The guided mode is at right angles to both the parallel and perpendicular electric fields. Second, using optical coupling mostly parallel to the growth direction, the guided wave has a propagation vector colinear with the perpendicular electric field and at right angles to the parallel field. The optically active material is aligned to the respective fields required for the desired extraction and modulation effects.

The present invention is preferably for an active region comprising of multiple quantum wells using AlGaAs semiconductors. The electric fields are established via a single n-type dopant species in an attempt to make the said device compatible with monolithic microwave integrated circuits processing suitable for high frequency implementations. Other implementations such as using p-type only or conventional methods of generating the required electric fields by using p-type and n-type layers to form p-i-n diodes are also possible. It should also be noted that hetero structure material systems from other III-V (e.g. InGaAsAIP), II-IV (CdZnTe), IV-IV (SiGe) or amorphous silicon compounds may equally be applied to this technology.

Therefore in one form of the invention though this need not be the only or indeed the broadest form there is proposed an optical device including;

means responsive to light for generating a photo-current including;

a structure having a semiconductor quantum well region, and a means for the simultaneous application of non-parallel electric fields to said quantum well structure.

In preference, the non-parallel electric fields are perpendicular to each other.

In preference, one electric field functions in the electronic transport for the extraction injection of electrons and/or holes perpendicular to the quantum well direction via a parallel electric field directed with the vector lying in the plane of the quantum well layers.

In preference, the other electric field is a perpendicular electric field with the vector parallel to the growth axis and is used for modulation of absorption profile of the quantum well structure.

In preference, the perpendicular electric field is generated by single broken species.

In preference, a dark current perpendicular to the layers is controlled by barrier layers disposed at either side of the active region and further sandwiched between the said n-type layers.

The barrier layers thus provide a high energy potential to the electrons (and holes) along the growth direction. The barrier may be either bulk or superlattice material allowing the use of n-type dopants if p-type dopants are not possible.

In preference, the device includes strained layer quantum well material within the active region grown on crystallographic orientations. This enhances the piezo electric coefficient of the material since one can generate a piezo electric field with vector lying either at parallel or perpendicular to the growth directions. A device which has a piezo electric field lying within the plane can be externally modulated via the parallel electric field contact arrangement whilst simultaneously using the QCSE to modulate the energy bands quantised along the growth direction.

With such a device with a piezo electric vector lying in parallel to the growth direction of strained quantum wells also allows the operation of dual field devices which can modulate the exciton energy so as to produce blueshifting modulator/detector.

By controlling the extraction of photo carriers parallel to the quantum wells, the optical response of the device can be varied. That is, by reducing the extraction efficiency of photo generated charge in the active region, electrons in holes will accumulate especially opposite regions of the barrier material-active layer interface (for non zero electric field power to the growth direction). The space charge generated in this way can reduce the electric field parallel to the growth direction and thereby provide a switching function.

By injecting charge carriers into the device by either allowing tunnelling of thermionic emissions of carriers from the dot regions or via the n-plane contacts, a device can be made to alter its absorption properties by phase space filling effects. This may be able to switch the exciton resonance off due to the population of quantised energy levels by electrically injected carriers.

Such an optical modulation enhanced device can be fabricated in AlGaAs and can act as a modulator or a receiver. The device can further be suitable for plane integration.

By utilising strained layer quantum well material for the active region, the electronic structure of the valence band can be dramatically altered. The n-plane dispersion of the valence band of quantum well structures can be warped so as to decrease the n-plane heavy hole effective mass close to the brillouin zone centre for zinc blend host layer materials. The capability of extracting of these modified heavy-holes in the plane of the quantum well allows the device to operate in high speeds.

The electro spacing for the electrical contacting of the dual field device can enhance its operation as a transmission and reflection optical grating elements. The intensity of the transmitted and reflected diffraction orders are controlled by the electro optic parameters of the active layer.

The single dopant structure may not need to contain the depletion region to function. That is, devices such as hetero junction bipolar transistors require the base to be doped opposite to the emitter and the collector regions. Similarly field effect resistors such as MESFET and HENT require the use of Schottky gate contacts to alter the conducting channel properties. The present device therefore may not have a built in electric field across the active region when an external device is not present.

BRIEF DESCRIPTION OF THE DRAWINGS

To assist in understanding the invention reference is made to the following drawings in which:

FIG. 7 is a photograph view showing the invention manufactured into two different configurations, being a modulator and receiver;

DESCRIPTION OF THE PREFERRED EMBODIMENT

Figure 1:
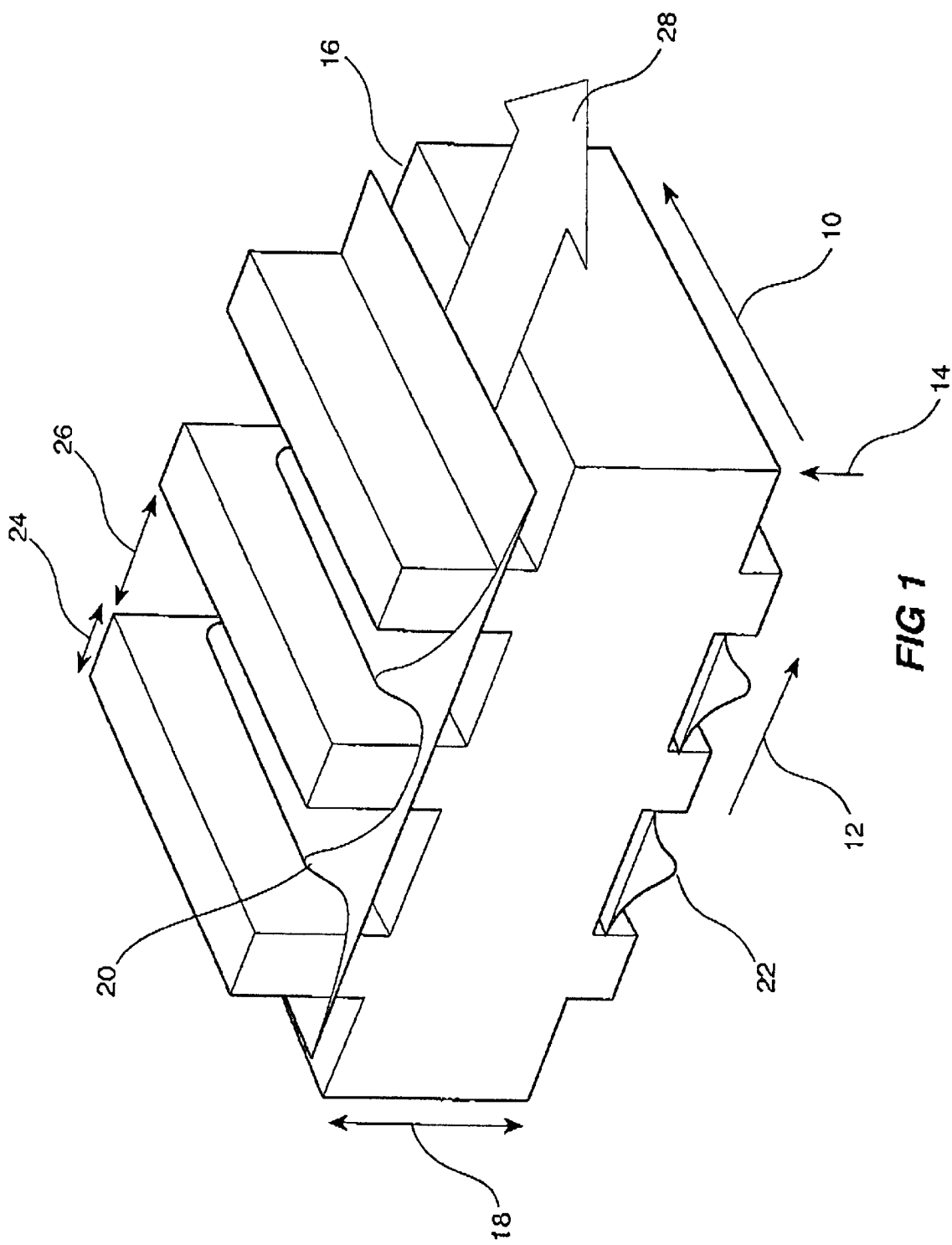
FIG. 1 is a schematic potential energy diagram of carrier transport perpendicular to multiple quantum well (MQW) layers via a tunnelling process.

Referring now to the figures in detail there is shown in FIG. 1 typical carrier transportation that is perpendicular to multiple quantum well layers via the tunnelling process. Shown is an opto-electronic device extending in the X-Y plane 10, Z plane 12 with valence band 14, conduction band 16 and Egw (energy gap between the electrons and holes) e18. The coupled QW electron wavefunction is shown as 20 whilst the heavy-hole wavefunction is 22, Lb (width of blocking layer) being 24 and Lw (width of the well) is 26. The perpendicular transport electron current is shown as 28.

Figure 2:
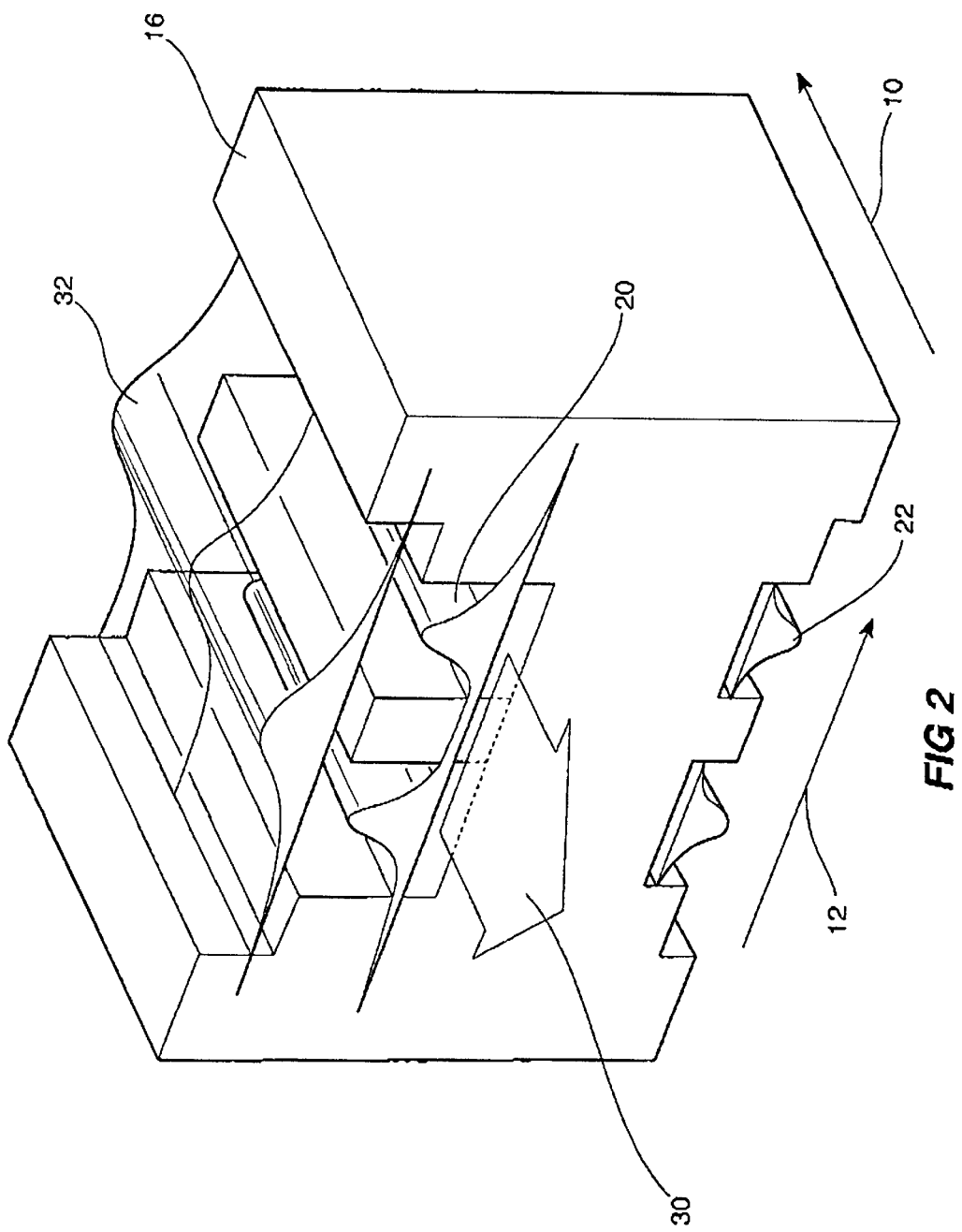
FIG. 2 is a schematic diagram of a carrier transport parallel to multiple quantum well layers.

FIG. 2 exemplifies carrier transport parallel to the MQW layers. The transport electron current 30 is now parallel to the multiple quantum well layers and the quasi-continuum is represented by 32. The materials used AlGaAs semiconductor material.

Figure 3:
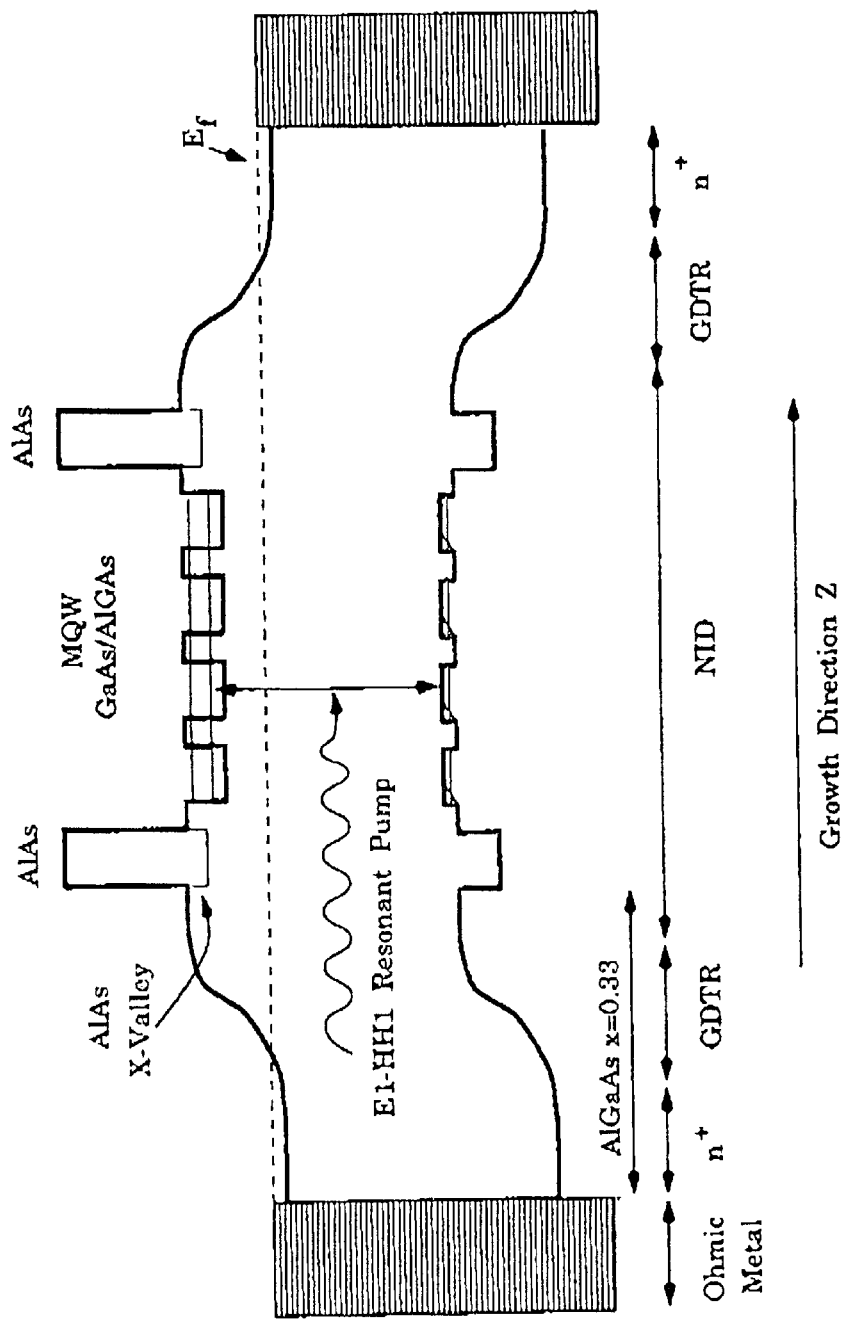
FIG. 3 is a graph showing potential energy versus growth direction for the n-i (MQW)-n-structure.
Figure 4:
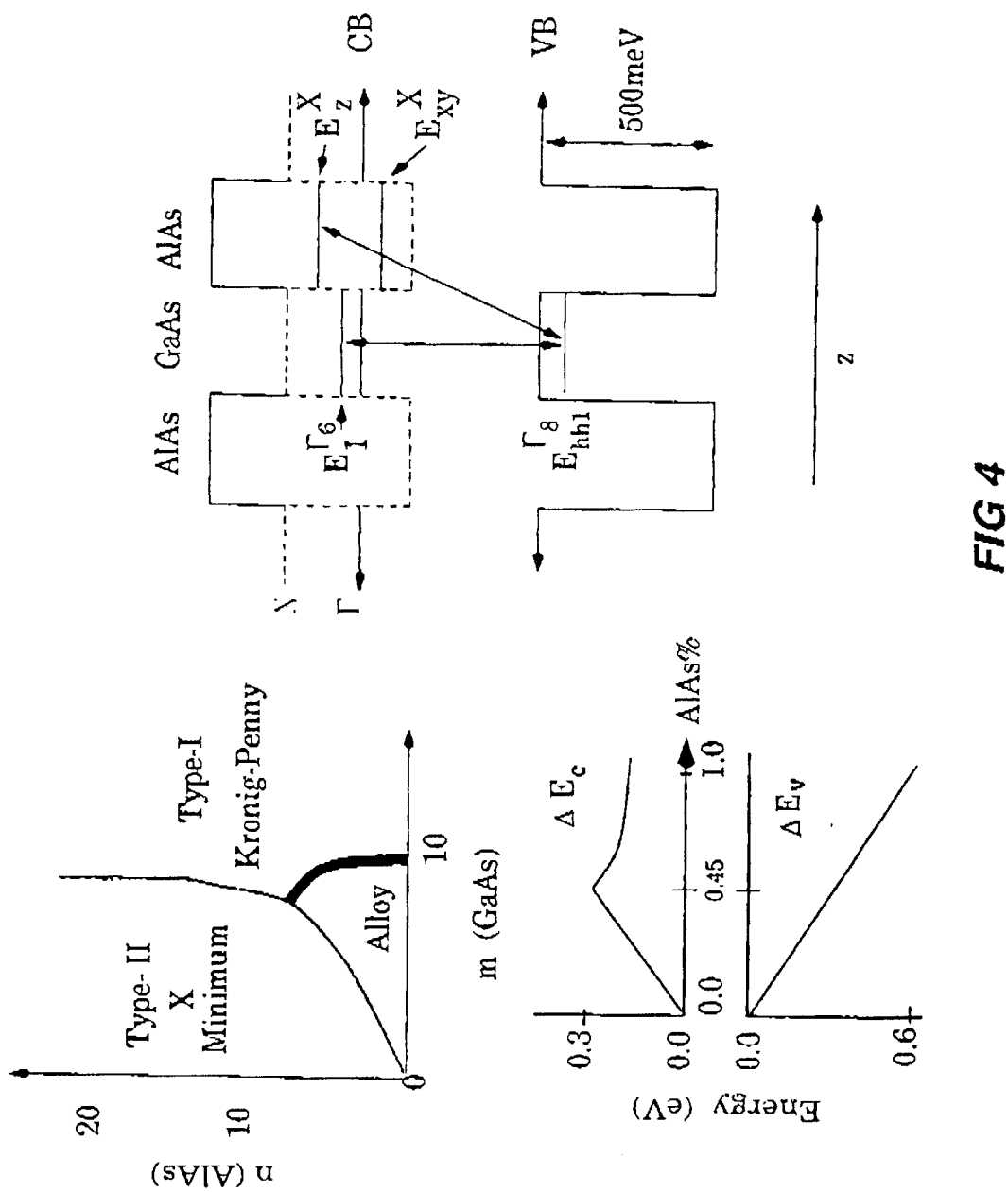
FIG. 4 are graphs of the gamma—x valley mixing effects for ALAs barriers.

FIG. 3 is a schematic diagram showing potential energy versus growth direction for the n-i (MQW)-n structure. FIG. 4 shows the mixing effects in the use of aluminium arsenide barriers whereby gallium arsenide and aluminium arsenide superlattice can force type-I configuration.

Figure 5:
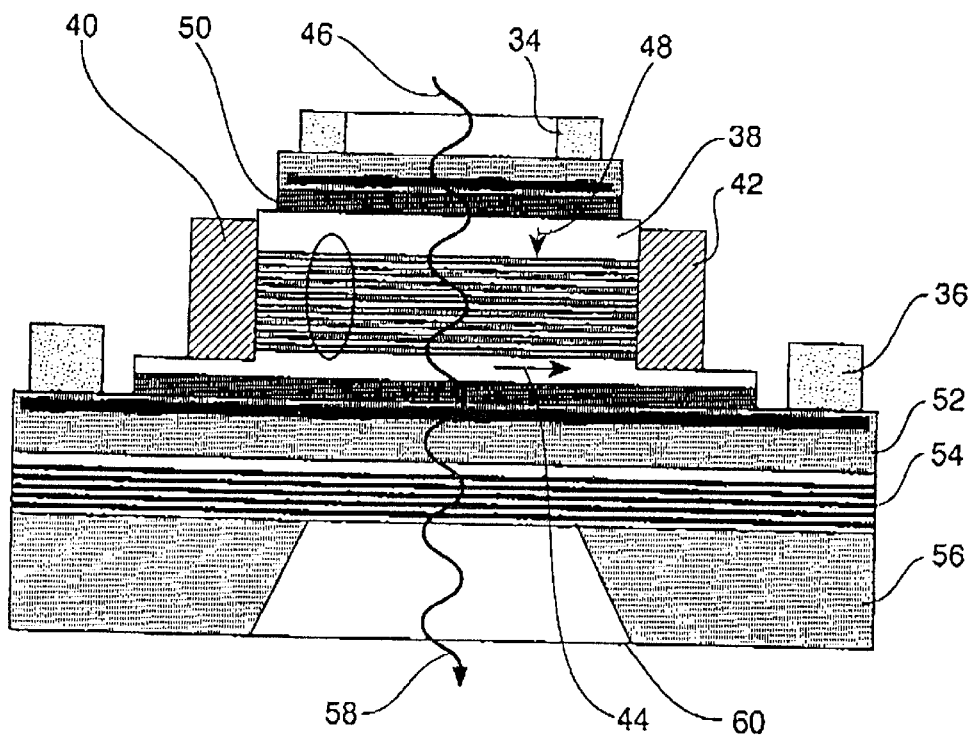
FIG. 5 is a schematic diagram showing the theory of operation of the present invention.

Turning now to FIG. 5, this is a schematic diagram of the operation of the present invention. The device consists of an emitter 34 and a collector 36. A voltage that is applied between a collector and an emitter produces an electric field that is essentially perpendicular to the multiple quantum well layers 38, that is parallel to the growth direction. When a simultaneous voltage is applied between the source 40 and drain 42 contacts, an electric field that is parallel to the multiple quantum well layers is generated, the electric field represented by 44.

When optical radiation 46 is incident upon the device with energy that is resonant to the multiple quantum well exciton transitions, electrons and holes are generated in the active region. The perpendicular field 44 will spatially separate the electrons and holes to either the source 40 or the drain 42 depending upon the polarity of the voltage between the drain and the source.

The perpendicular field 48 shifts the exciton absorption energy via the quantum confined Stark effect. As the aluminium arsenide blocking layers 50 inhibit photo-current to flow vertically through the structure, the photo-current is able to be extracted without affecting the voltage between the collector and emitter.

Further parts of the device include the n-doped layer 52 the SL buffer layer 54 and a SI gallium arsenide layer 56. The device produces an output optical signal 58, and further includes a wet etched optical VIA 60.

Figure 6:
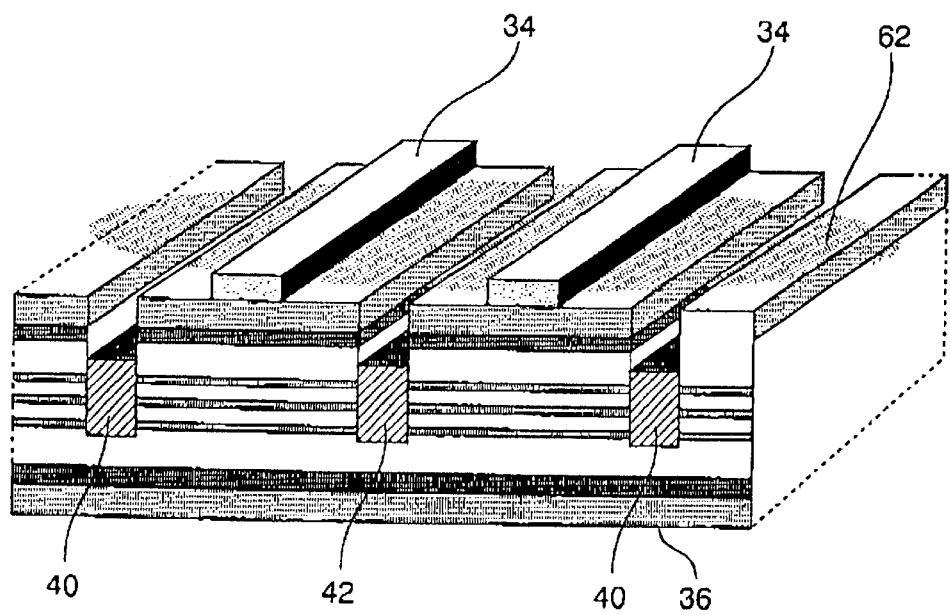
FIG. 6 is a schematic diagram showing high density packing of a folded electrode configuration.

Turning now to FIG. 6, this shows a high density packing of a folded electrode configuration. It is to be understood that the optical coupling efficiency into the multiple quantum well active region is determined by the ratio of electrical contact area to the optical window area. It is seen that the system consists of multiple emitters 34, collector 36, sources 40 and drain 42. The focused light beam 62 impinges upon the device. It is important to note that the drain/source contacts are shown as recessed etched areas using a shallow only process (so as to not shortout the lower n-type layer), conventional HEMT ohmic alloying techniques to contact the channel could very well be used. Alternatively, drain and source contacts to the MQW can be made via ion-implantation techniques allowing monolithic fabrication.

Figure 8:
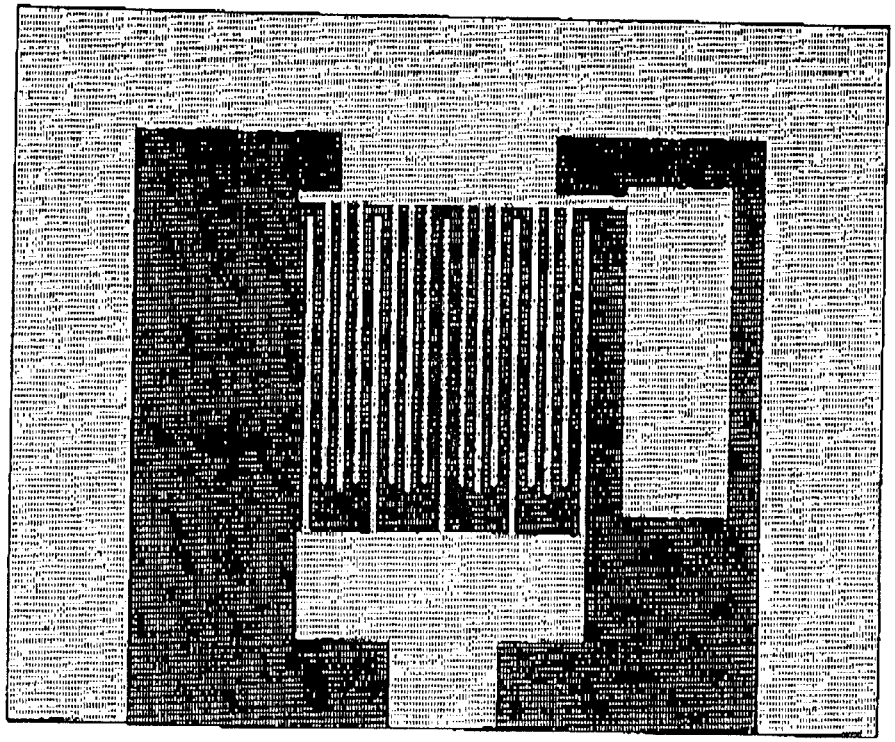
FIG. 8 shows the present invention with high density of finger electrodes.

FIG. 7 shows the invention realised in two different configurations, the top diagram shows the emitter/collector electrodes being optimised for high frequency operation (modulator) the lower shows the drain/source electrodes optimised for high frequency operation (receiver). FIG. 8 shows the invention realised with a high density of figure electrodes (electrode width being some 2 microns).

Figure 9:
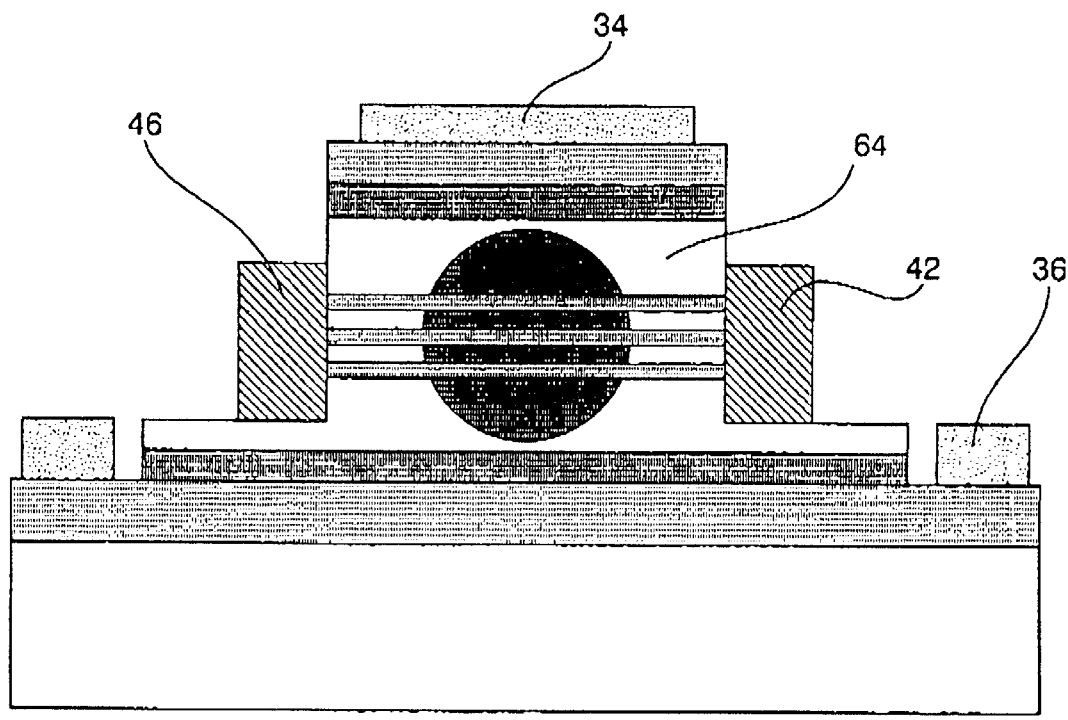
FIG. 9 shows a schematic diagram of a configuration of the present invention as an optical wave guiding modulator.

FIG. 9 shows an example of the embodiment of the invention configured as an optical wave guide modulator including source 40, drain 42, emitter 34 and collector 36. The optically confined wave guide region 64 can be optimised with barrier and active layer refractive indice. Graded layers of AlGaAs/AnGaAs for example can be used in separating the region between the emitter and the collector. The wave guide device requires less periods of the quantum well and therefore the device can be reduced in size further still. The device may be well suited for InGaAs/InP applications and can function as an amplitude or phase modulator. Injection of a parallel current can modify the refractive index of the guiding region and this effect can be used for wavelengths that are not resonant with the MQW (multiple quantum well) exciton resonance.

Figure 10:
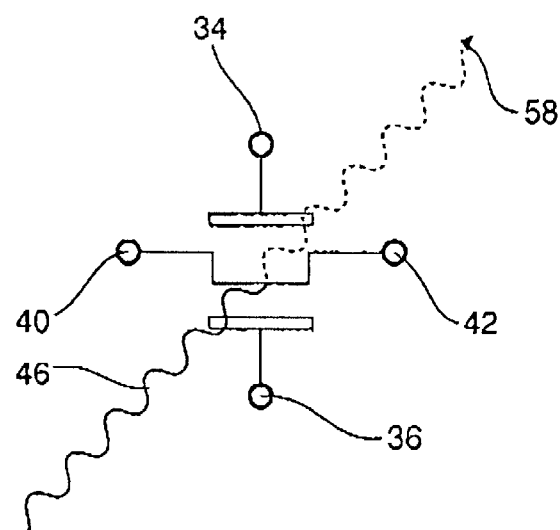
FIG. 10 is a schematic diagram showing the equivalent opto-electronic circuit of the invention.

FIG. 10 is a schematic diagram showing the equivalent opto electronic circuit of the invention, including the emitter 34, collector 36, source 40, drain 42, input optical signal 46 and output optical signal 58.

Figure 11:
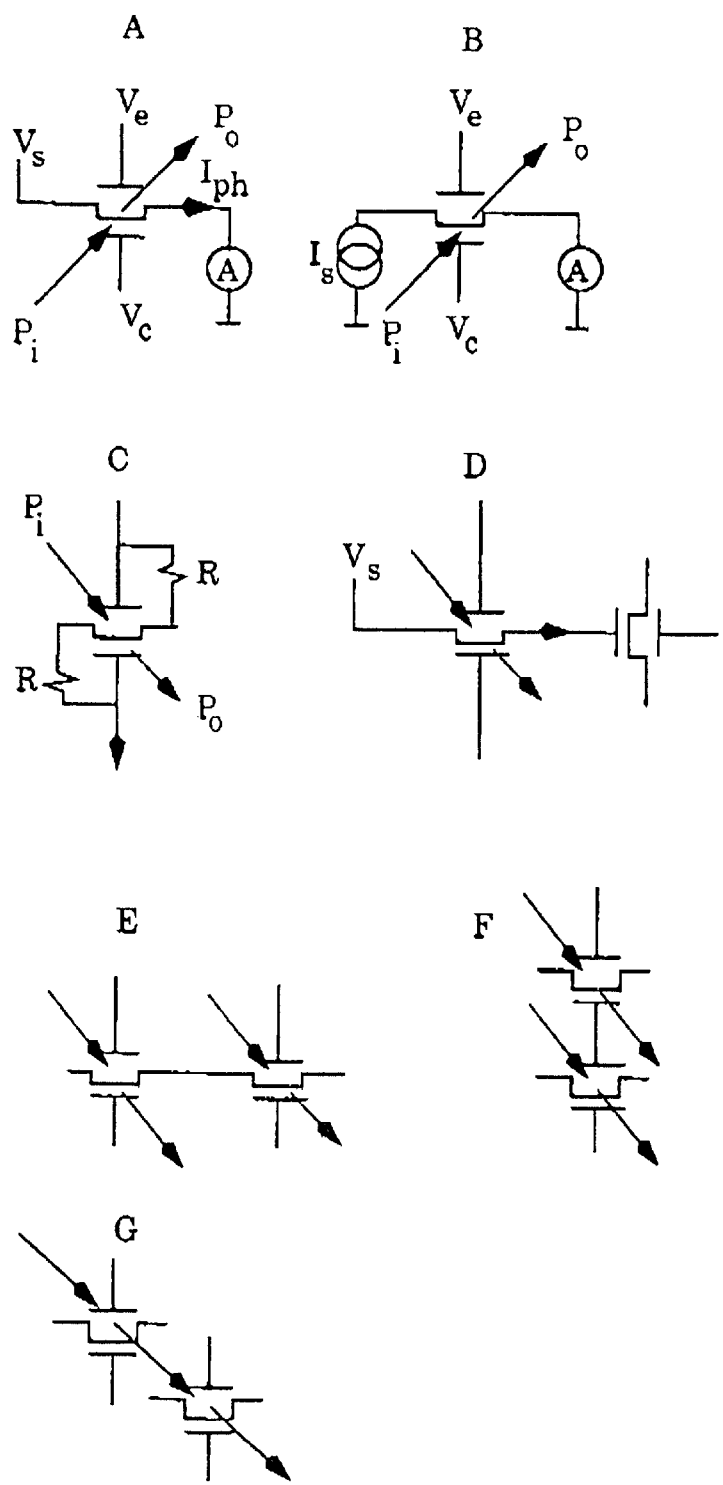
FIG. 11 are examples of opto-electronic implementation of the invention demonstrating there multifunction nature.

FIG. 11 shows examples of the opto electronic implementation of the present invention demonstrating the multi function nature wherein Pi is the input optical signal and Po is the output optical signal.

Figure 12:
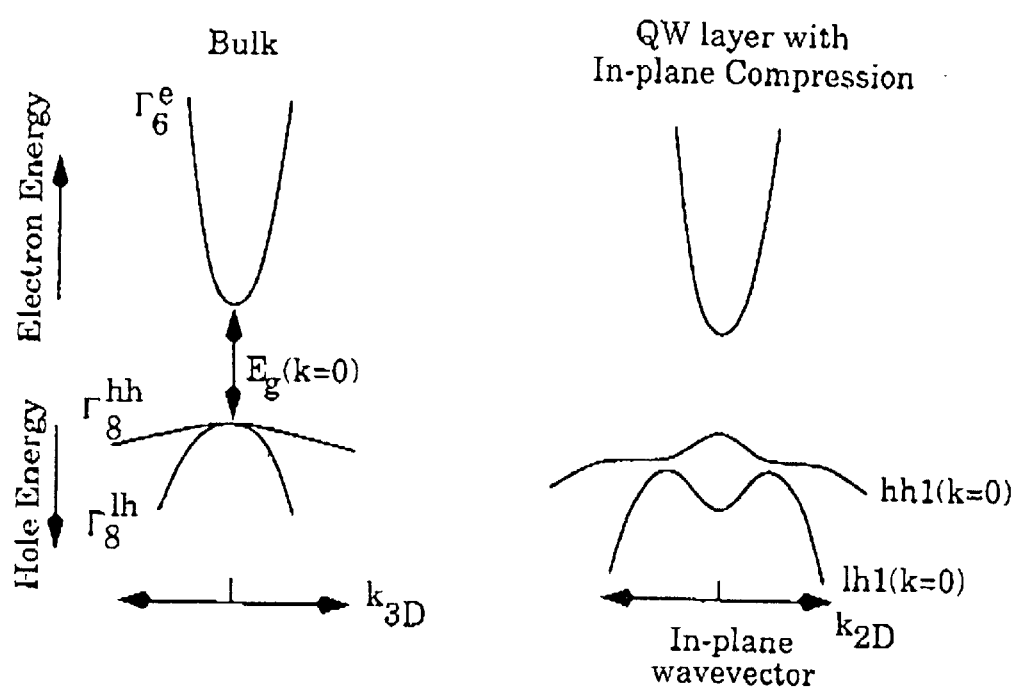
FIG. 12 are diagrams of the electron/hole energies.

FIG. 12 are examples of the electron/holes energies. The valence band warping decreases the heavy hole effective mass close to the gamma point by use of strained layers (pseudomorphically grown lattice mismatched hetero structures).

Figure 13:
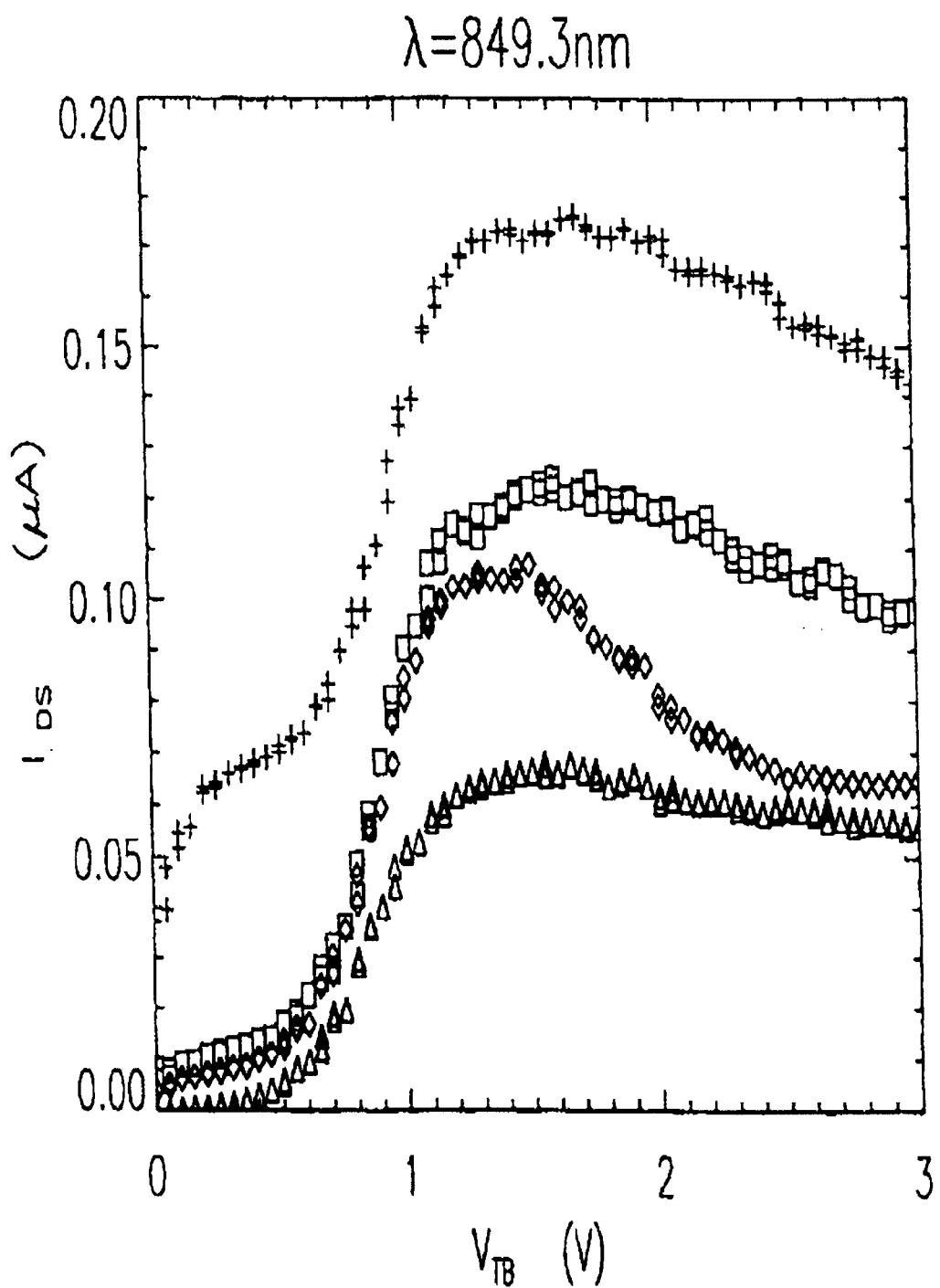
FIG. 13 is a plot of the typical performance of the fabricated devices of FIGS. 7 and 8.

FIG. 13 shows a typical performance of fabricated devices of FIGS. 7 and 8.

Shown is the photocurrent extracted from MOW region as a function of electric field parallel to the growth axis. The family of curves are for drain-source voltages with fixed optical wavelength and intensity. The wavelength chosen was set slightly lower in energy than the zero field n=1 excitation energy.

As VTB increases, the exciton energy redshifts via the Quantum Confined Stark Effect and becomes in and again out of resonance with the incident photon energy thereby producing a non-linear response with negative differential resistance.

Figure 14:
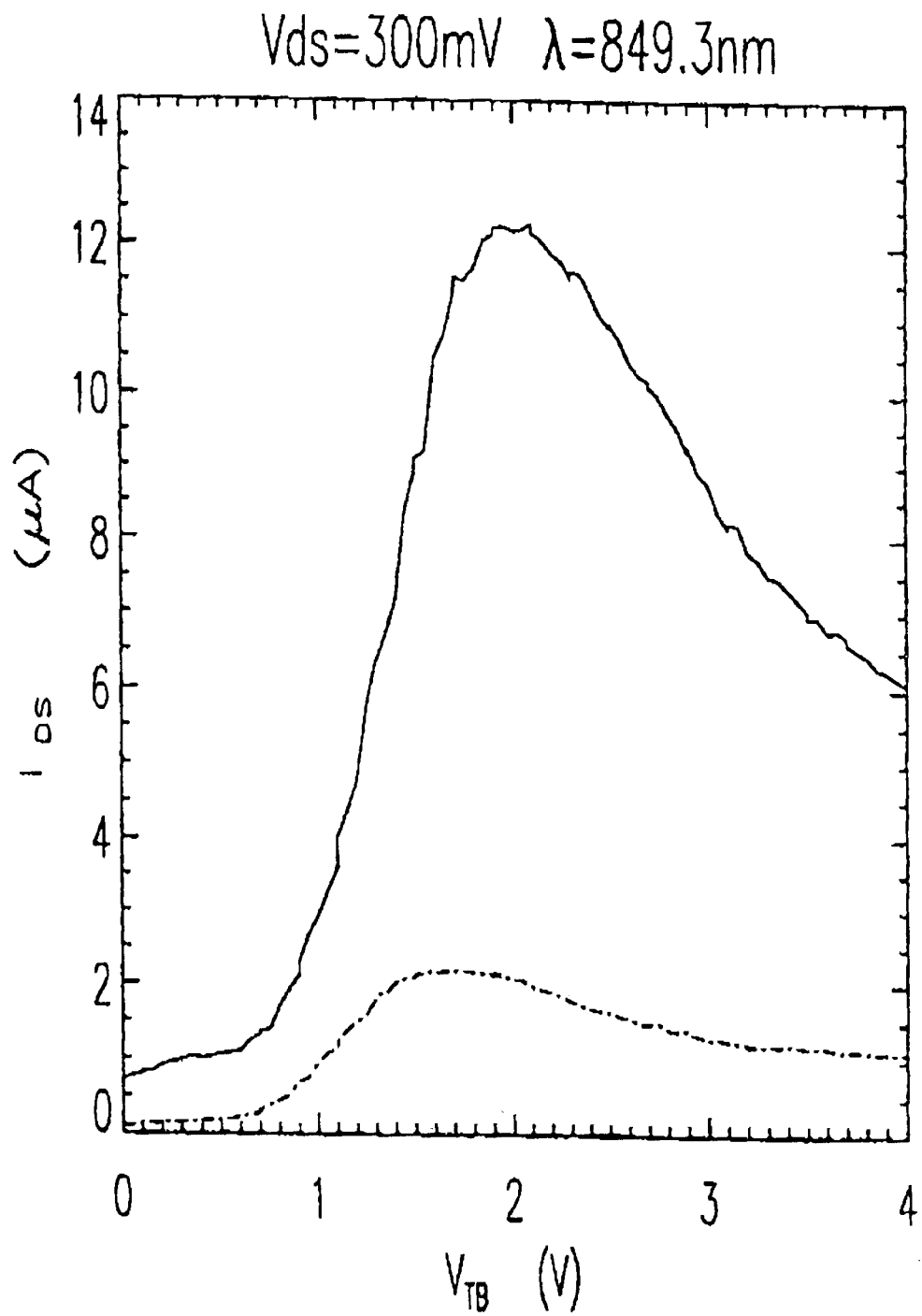
FIG. 14 is a plot demonstrating extraction of photocurrent as a function of an electric field parallel to the growth axis.

FIG. 14 demonstrates extraction of photocurrent as a function of electric field parallel to the growth axis, with fixed wavelength and parallel field, The two curves demonstrate an increase in responsivity with increasing optical power.

FIGS. 15 and 16 demonstrate an optical waveguide mode and monolithic travelling waveguide cross-field device respectively.

It is also to be understood that one should be able to adapt the above invention for the generation of light. That is, by applying a photo-current to the device one should be able to generate optical radiation. Obviously though, some of the geometry of the present invention will have to be modified to accomplish this effect.

The present invention is thus seen as in improvement for electronic and opto-electronic devices for modulation, detection and emission using a parallel field in the presence of a perpendicular field to multiple quantum well layers. In empirical observations it has been found that the efficiency of the device is close to 100%.

The claims defining the invention are as follows:
1. An optical device including;

means responsive to light for generating a photo-current including;
 a structure having a semiconductor quantum well region and including an active region; and a means for the simultaneous application of non-parallel electric fields to said quantum well structure, and a means wherein a dark current perpendicular to the structure is controlled by barrier layers disposed at either side of the active region and further sandwiched between n-type layers.

2. An optical device as in claim 1 wherein the non-parallel electric fields are perpendicular to each other.

3. An optical device as in claim 1 wherein a first electric field functions in the electric field functions in the electronic transport of the extraction and/or injection of electrons and/or holes in the quantum well region via a parallel electric field directed with a vector lying substantially in the plane of the quantum well layers.

4. An optical device as in claim 1 wherein a second electric field is a perpendicular electric field with the vector parallel to a growth axis of the structure and is used for the modulation of absorption profile of the quantum well structure.

5. An optical device as in claim 1 further including strained layer quantum well material within the active region grown on crystallographic directions.

6. An optical device as in claim 1, and an emitter and collector disposed apart across said structure in a direction perpendicular to the plane of the quantum well layers and;

a source and drain disposed apart across said structure in a direction perpendicular to the plane of the quantum well layers and a first voltage source providing a voltage between said source and drain resulting in a parallel electric field extending across the said layers; and a second voltage source providing a voltage between said emitter and collector resulting in an electric field perpendicular to the said layers; wherein when optical radiation is incident upon said device with both fields present, said device generates electrons and holes which are spatially separated due to the perpendicular electric field and parallel electric field allowing the extraction of a photo-current without affecting the voltage between said collector and emitter.

* * * * *